United States Patent
Huang et al.

(10) Patent No.: US 12,446,243 B2
(45) Date of Patent: Oct. 14, 2025

(54) SEMICONDUCTOR CELL STRUCTURE, IGBT CELL STRUCTURE, SEMICONDUCTOR STRUCTURE, AND METHOD FOR MANUFACTURING IGBT CELL STRUCTURE

(71) Applicant: BYD SEMICONDUCTOR COMPANY LIMITED, Shenzhen (CN)

(72) Inventors: Baowei Huang, Shenzhen (CN); Haiping Wu, Shenzhen (CN)

(73) Assignee: BYD SEMICONDUCTOR COMPANY LIMITED, Shenzhen (CN)

(*) Notice: Subject to any disclaimer, the term of this patent is extended or adjusted under 35 U.S.C. 154(b) by 398 days.

(21) Appl. No.: 18/187,852

(22) Filed: Mar. 22, 2023

(65) Prior Publication Data
US 2023/0246096 A1    Aug. 3, 2023

Related U.S. Application Data

(63) Continuation of application No. PCT/CN2021/120182, filed on Sep. 24, 2021.

(30) Foreign Application Priority Data

Sep. 24, 2020 (CN) .......................... 202011017235.3

(51) Int. Cl.
H10D 12/00 (2025.01)
H10D 12/01 (2025.01)
H10D 62/10 (2025.01)

(52) U.S. Cl.
CPC ......... *H10D 12/481* (2025.01); *H10D 12/038* (2025.01); *H10D 62/127* (2025.01)

(58) Field of Classification Search
CPC ... H10D 12/481; H10D 12/038; H10D 62/127
(Continued)

(56) References Cited

U.S. PATENT DOCUMENTS

2003/0080378 A1    5/2003    Zundel et al.
2010/0078674 A1    4/2010    Seok et al.

FOREIGN PATENT DOCUMENTS

CN    105027292 A        11/2015
CN    107799582 A  *     3/2018    ........... H10D 64/511
(Continued)

OTHER PUBLICATIONS

The World Intellectual Property Organization (WIPO) International Search Report for PCT/CN2021/120182 Dec. 24, 2021 6 Pages.

*Primary Examiner* — Igwe U Anya
(74) *Attorney, Agent, or Firm* — Wenye Tan

(57) ABSTRACT

An insulated gate bipolar transistor (IGBT) cell structure includes an N-type drift layer, an N-type termination layer, a P-type collector layer, and a collector metal layer stacked in sequence. On a side of the N-type drift layer away from the P-type collector layer and in the N-type drift layer, the IGBT cell structure includes: two first trenches spaced apart from each other, a trench-shaped insulating oxide layer formed on an inner wall of each of the first trenches, a polysilicon electrode located in the trench-shaped insulating oxide layer, a second trench formed on the inner wall of the first trench, a trench-shaped gate oxide layer located in the second trench, a polysilicon gate located in the trench-shaped gate oxide layer, a P well region located between the first trenches, and two floating P regions spaced apart from each other.

13 Claims, 8 Drawing Sheets

(58) Field of Classification Search
USPC .......................................................... 257/139
See application file for complete search history.

(56) References Cited

FOREIGN PATENT DOCUMENTS

| | | | | |
|---|---|---|---|---|
| CN | 108428740 | A | 8/2018 | |
| CN | 109065618 | A | 12/2018 | |
| CN | 109244128 | A | 1/2019 | |
| CN | 110854186 | A | 2/2020 | |
| CN | 111384149 | A * | 7/2020 | ........... H10D 12/038 |
| CN | 107731897 | B | 10/2020 | |
| JP | 2006049455 | A | 2/2006 | |
| JP | 2009043782 | A | 2/2009 | |
| JP | 2012064641 | A | 3/2012 | |
| JP | 2014060387 | A | 4/2014 | |
| JP | 2018157190 | A | 10/2018 | |

\* cited by examiner

SEMICONDUCTOR CELL STRUCTURE, IGBT CELL STRUCTURE, SEMICONDUCTOR STRUCTURE, AND METHOD FOR MANUFACTURING IGBT CELL STRUCTURE

CROSS-REFERENCE TO RELATED APPLICATIONS

The present application is a continuation application of PCT application No. PCT/CN2021/120182 filed on Sep. 24, 2021, which claims priority to Chinese Patent Application No. 202011017235.3, filed on Sep. 24, 2020 and entitled "IGBT CELL STRUCTURE, SEMICONDUCTOR STRUCTURE, AND METHOD FOR MANUFACTURING IGBT CELL STRUCTURE". The entire content of all of the above-referenced applications is incorporated herein by reference.

FIELD

The present disclosure generally relates to the field of semiconductor manufacturing, and more specifically, to a semiconductor cell structure, an insulated gate bipolar transistor (IGBT) cell structure, a semiconductor structure, and a method for manufacturing an IGBT cell structure.

BACKGROUND

New semiconductor power devices, such as an insulated gate bipolar transistor (IGBT), have advantages such as a low conduction loss, a high input impedance, a simple driving circuit, a low driving power, and a high turn-on speed. In order to obtain a power control system with a higher power and higher efficiency, the IGBT is developing in a low-conduction-loss and low-switching-loss direction.

In the past nearly forty years, the IGBT experienced a PT-NPT-FS development in terms of a vertical structure, and developed from a planar gate to a trench gate structure in terms of a surface structure, which greatly reduces the conduction loss and the switching loss of the IGBT.

The introduction of a floating P region greatly reduces a conduction drop of the trench IGBT, improves a carrier storage effect, and greatly relieves the contradiction between a forward conduction drop Vce and a turn-off time toff of a device compared with a conventional trench IGBT.

However, in the existing floating P-type trench IGBT, a contact surface between a gate and a collector that form a Miller capacitance spans most of an area of the trench, and a dielectric layer is an extremely thin gate oxide layer. Therefore, the Miller capacitance of the existing floating P-type trench IGBT is very large. During switching of the device, the Miller capacitance adds an additional displacement current to the gate based on a gate driving current. A large Miller capacitance leads to a large displacement current in the gate of the device, which affects a voltage of the gate. During switch-on of the device, a large Miller capacitance leads to problems such as a large voltage change rate dv/dt, a high current peak, and electromagnetic compatibility (EMC) during reverse recovery of a freewheeling diode used in collaboration. In addition, a large Miller capacitance increases the turn-on time and the turn-off time of the device, resulting in large turn-on and turn-off losses of the device.

SUMMARY

In view of the defects or disadvantages in the related art, a semiconductor cell structure, an insulated gate bipolar transistor (IGBT) cell structure, a semiconductor structure, and a method for manufacturing an IGBT cell structure are desired.

In a first aspect, an embodiment of the present disclosure provides an IGBT cell structure, including an N-type drift layer, an N-type termination layer, a P-type collector layer, and a collector metal layer stacked in sequence. On a side of the N-type drift layer facing away from the P-type collector layer and in the N-type drift layer, the IGBT cell structure includes: two first trenches spaced apart from each other, a trench-shaped insulating oxide layer formed on an inner wall of each of the first trenches, a polysilicon electrode located in the trench-shaped insulating oxide layer, a second trench located in the first trench, a trench-shaped gate oxide layer located in the second trench, a polysilicon gate located in the trench-shaped gate oxide layer, a P well region located between the first trenches, and two floating P regions spaced apart from each other.

In a second aspect, the present disclosure provides a semiconductor structure, including a plurality of IGBT cell structures in parallel described above. A depth of the floating P region of the IGBT cell structure is the same as a depth of the first trench, and floating P regions of two adjacent IGBT cell structures are connected to form a floating P region.

In a third aspect, the present disclosure provides a semiconductor structure, including a plurality of IGBT cell structures in parallel described above. Between two adjacent IGBT cell structures, at least one intermediate trench is further arranged in the N-type drift layer; a trench insulating oxide layer is arranged in the intermediate trench; an intermediate polysilicon layer is arranged in the trench insulating oxide layer; the intermediate trench is formed on the same layer as the first trench; the trench insulating oxide layer is formed on the same layer as the trench-shaped insulating oxide layer; and the intermediate polysilicon layer is formed on the same layer as the polysilicon electrode.

In a fourth aspect, the present disclosure provides a method for manufacturing an IGBT cell structure, including: providing an N-type substrate, wherein the N-type substrate has a front side and a back side opposite to each other; forming two first trenches spaced apart from each other in the N-type substrate through deposition, photoetching, and etching processes, forming a trench-shaped insulating oxide layer in each of the first trenches, and depositing polysilicon in the trench-shaped insulating oxide layer to form a polysilicon electrode region, wherein an opening of the trench-shaped insulating oxide layer faces the front side; forming a second trench in the first trench through deposition, photoetching, and etching processes, forming a trench-shaped gate oxide layer in the second trench, and forming a polysilicon electrode between the second trench and the trench-shaped insulating oxide layer; depositing polysilicon in the trench-shaped gate oxide layer to form a polysilicon gate; and forming a P well region between the two trench-shaped insulating oxide layers through P well implantation and junction push processes, and forming a floating P region on each of sides of the two trench-shaped insulating oxide layers facing away from the P well region, wherein the trench-shaped gate oxide layers in the two second trenches are adjacently connected with the P well region.

In a fifth aspect, the present disclosure provides a semiconductor cell structure, including an N-type drift layer, an N-type termination layer, a P-type collector layer, and a collector metal layer stacked in sequence. On a side of the N-type drift layer facing away from the P-type collector layer and in the N-type drift layer, the semiconductor cell structure includes: two first trenches spaced apart from each other, a trench-shaped insulating oxide layer formed on an inner wall of each of the first trenches, a polysilicon electrode located in the trench-shaped insulating oxide layer, a second trench formed on the inner wall of the first trench, a trench-shaped gate oxide layer located in the second trench, a polysilicon gate located in the trench-shaped gate oxide layer, a P well region located between the first trenches, and two floating P regions spaced apart from each other. The trench-shaped insulating oxide layer and the polysilicon gate in the first trench are both adjacently connected with the second trench in the first trench; the trench-shaped gate oxide layer is isolated from the trench-shaped insulating oxide layer through the polysilicon electrode. A depth of each of the floating P regions does not exceed a depth of the first trench. The floating P region is isolated from the P well region through the trench-shaped insulating oxide layer. The gate oxide layers in the two second trenches are adjacently connected with the P well region.

Compared with the related art, in the semiconductor cell structure provided in the present disclosure, the first trench is a dummy trench (that is, a pseudo trench), the second trench is a gate trench, and the two second trenches are adjacently connected with the P well region. Since a majority of the second trench falls in the first trench, and only a small part of the second trench is adjacently connected with the N-type drift layer to form a Miller capacitance, the semiconductor cell structure has a very small Miller capacitance, which improves the turn-on efficiency of the device and reduce the switching loss of the device.

DETAILED DESCRIPTION

Figure 1:
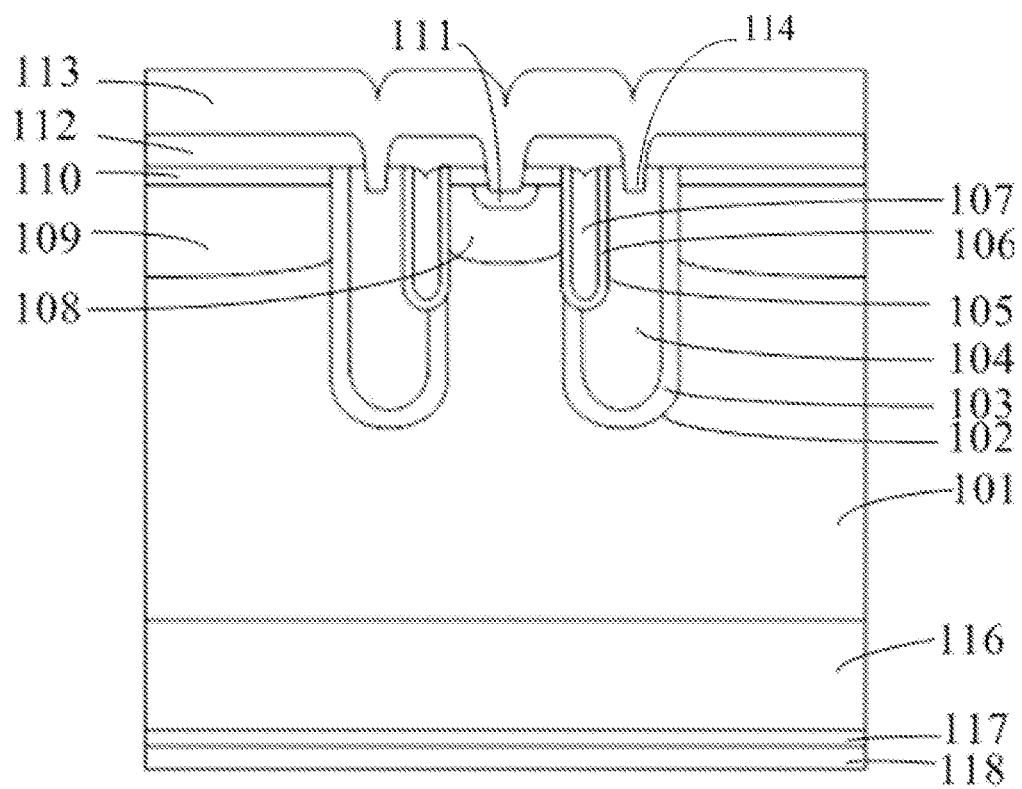
FIG. 1 is a schematic structural diagram of a semiconductor cell structure according to an embodiment of the present disclosure.

The present disclosure is described below in further details with reference to the accompanying drawings. It may be understood that the specific embodiments described herein are used for explaining but not limiting a related invention. It should be further noted that, for ease of description, only parts related to the invention may be shown in the drawings. It should be noted that the embodiments of the present disclosure and the features in the embodiments may be combined with each other in case of no conflicts.

An embodiment of the present disclosure provides a semiconductor cell structure, including an N-type drift layer, an N-type termination layer, a P-type collector layer, and a collector metal layer stacked in sequence.

On a side of the N-type drift layer facing away from the P-type collector layer and in the N-type drift layer, the semiconductor cell structure includes: two first trenches spaced apart from each other, a trench-shaped insulating oxide layer formed on an inner wall of each of the first trenches, a polysilicon electrode located in the trench-shaped insulating oxide layer, a second trench formed on the inner wall of the first trench, a trench-shaped gate oxide layer located in the second trench, a polysilicon gate located in the trench-shaped gate oxide layer, a P well region located between the first trenches, and two floating P regions spaced apart from each other.

The trench-shaped insulating oxide layer and the polysilicon gate in the first trench are both adjacently connected with the second trench in the first trench. The trench-shaped gate oxide layer is isolated from the trench-shaped insulating oxide layer through the polysilicon electrode. A depth of each of the floating P regions does not exceed a depth of the first trench. The floating P region is isolated from the P well region through the trench-shaped insulating oxide layer. The gate oxide layers in the two second trenches are adjacently connected with the P well region.

In this embodiment of the present disclosure, the semiconductor cell structure may be an IGBT semiconductor cell structure, or may be a metal oxide semiconductor (MOS) semiconductor cell structure. A main difference between the MOS semiconductor cell structure and the IGBT semiconductor cell structure is a back side of a substrate. The back side of the substrate of the IGBT semiconductor cell structure has an additional P-type substrate compared with the back side of the substrate of the MOS semiconductor cell structure. Front structures of the IGBT semiconductor cell structure and the MOS semiconductor cell structure are the same.

It may be understood that the semiconductor cell structure in this embodiment of the present disclosure may be the IGBT semiconductor cell structure or the MOS semiconductor cell structure. In the following, the semiconductor cell structure is the IGBT semiconductor cell structure, for example.

Currently, during operation of an existing semiconductor cell structure such as an IGBT cell structure, a switching speed of the device is reduced as a result of impact of a Miller capacitance, which increases the switching loss, and seriously affects the operating performance of the IGBT cell structure. Based on the above, the present disclosure provides a semiconductor cell structure, an IGBT cell structure, a semiconductor structure, and a method for manufacturing an IGBT cell structure.

As shown in FIG. 1, an embodiment of the present disclosure provides an IGBT cell structure, including an N-type drift layer 101, an N-type termination layer 116, a P-type collector layer 117, and a collector metal layer 118 stacked in sequence.

On a side of the N-type drift layer 101 facing away from the P-type collector layer 117 and in the N-type drift layer 101, the IGBT cell structure includes: two first trenches 102 spaced apart from each other, a trench-shaped insulating oxide layer 103 formed on an inner wall of each of the first trenches 102, a polysilicon electrode 104 located in the trench-shaped insulating oxide layer 103, a second trench 105 located on the inner wall of the first trench 102, a trench-shaped gate oxide layer 106 located on an inner wall of the second trench 105, a polysilicon gate 107 located in the trench-shaped gate oxide layer 106, a P well region 108 located between the first trenches 102, two floating P regions 109 spaced apart from each other, and an N+ emitter layer 110. The N+ emitter layer 110 is formed on sides of the floating P region 109 and the P well region 108 facing away from the P-type collector layer 117. A P+ region 111 connected with the N+ emitter layer 110 is arranged in the P well region 108.

On the side of the N-type drift layer 101 facing away from the P-type collector layer 117, the IGBT cell structure further includes an insulating dielectric isolation layer 112 and an emitter metal layer 113 arranged in sequence in a direction of being close to the P-type collector layer 117 to being far away from the P-type collector layer 117. The insulating dielectric isolation layer 112 covers the N+ emitter layer 110, the trench-shaped insulating oxide layer 103, the polysilicon electrode 104, the trench-shaped gate oxide layer 106, and the polysilicon gate 107. The insulating dielectric isolation layer 112 has an opening 114 from which the polysilicon electrode 104 and the P+ region 111 are exposed. The emitter metal layer 113 covers the insulating dielectric isolation layer 112 and fills the opening 114.

The trench-shaped insulating oxide layer 103 and the polysilicon electrode 104 in the first trench are both adjacently connected with the second trench in the first trench. The trench-shaped gate oxide layer 106 is isolated from the trench-shaped insulating oxide layer 103 through the polysilicon electrode 104. A depth of each of the floating P regions 109 does not exceed a depth of the first trench 102. The floating P region 109 is isolated from the P well region 108 through the trench-shaped insulating oxide layer 103. The gate oxide layers 106 in the two second trenches 105 are adjacently connected with the P well region 108.

In the IGBT cell structure provided in this embodiment, the first trench is a dummy trench (a pseudo trench), the second trench is a gate trench, and the P well region is located between the two second trenches (that is, two gate trenches). Since the second trench is located in the first trench, and only a small part of the second trench is adjacently connected with the N-type drift layer to form a Miller capacitance, for example, a length of the contact position between the second trench and the N-type drift layer is 200 nm, or even 100 nm, the IGBT cell structure has a very small Miller capacitance, which improves the turn-on efficiency of the device and reduce the switching loss of the device.

A collector-emitter capacitance equivalently exists between a collector and emitter an of the IGBT cell structure, which is a capacitance Cce. An equivalent gate-emitter capacitance exists between the emitter and a gate, which is a capacitance Cge. An equivalent gate-collector capacitance exists between the collector and the gate, which is a capacitance Cgc. The capacitance Cgc is also referred to as the Miller capacitance. An input capacitance of the IGBT cell structure is Cies=Cge+Cgc. In this embodiment, the polysilicon electrode is a polysilicon emitter, a region inside the second trench is a gate region, a surrounding region of the second trench is substantially adjacently connected to the emitter. Therefore, the IGBT cell structure provided in this embodiment has a large input capacitance, which can further reduce the impact of a displacement current caused by a feedback capacitance on a voltage of the gate, and the gate of the device is not easily affected by a current change.

A semiconductor material includes polysilicon, monocrystalline silicon, silicon carbide, gallium nitride, zinc oxide, or the like.

Further, the depth of the first trench 102 ranges from 4 μm to 8 μm, and a depth of the second trench 105 ranges from 2 μm to 5 μm. The first trench is deeper than the second trench. On the one hand, each first trench has the second trench formed therein, the two second trenches are adjacently connected to the P well region, and the second trench falls in the first trench, which ensures that only a small contact area is formed between the gate region and the N-type drift region, so that the device has a small Miller capacitance. On the other hand, the first trench is in contact with the N-type drift region, the first trench is made deeper, and the floating P region is formed on an outer side of the first trench. The first trench and the floating P region can reduce an electric field at a bottom of the trench and improve a reverse voltage withstanding capability of the device. During conduction of the device, the first trench and the floating P region enable a surface of the device to store a large number of minority carriers, which reduces a conduction drop of the device.

Preferably, a width of the second trench 105 is less than a width of the first trench 102 by a range of 0.6 μm to 1.0 μm, the width of the first trench 102 ranges from 1.4 μm to 2.2 μm, and the width of the second trench 105 ranges from 0.8 μm to 1.2 μm, to ensure that the first trench can surround the second trench.

Further, a doping concentration of the P well region 108 ranges from $1\times10^{16}$ cm$^{-3}$ to $1\times10^{19}$ cm$^{-3}$; and/or
   a doping concentration of the P+ region 111 ranges from $1\times10^{19}$ cm$^{-3}$ to $1\times10^{22}$ cm'; and/or
   a doping concentration of the N+ emitter layer 110 ranges from $1\times10^{19}$ cm$^{-3}$ to $1\times10^{23}$ cm$^{-3}$.

Specifically, at least one of the following doping concentration conditions is satisfied:
   the doping concentration of the P well region ranges from $1\times10^{16}$ cm$^{-3}$ to $1\times10^{19}$ cm$^{-3}$;
   the doping concentration of the P+ region ranges from $1\times10^{19}$ cm$^{-3}$ to $1\times10^{22}$ cm$^{-3}$; and
   the doping concentration of N+ emitter layer ranges from $1\times10^{19}$ cm$^{-3}$ to $1\times10^{23}$ cm$^{-3}$.

Figure 2:
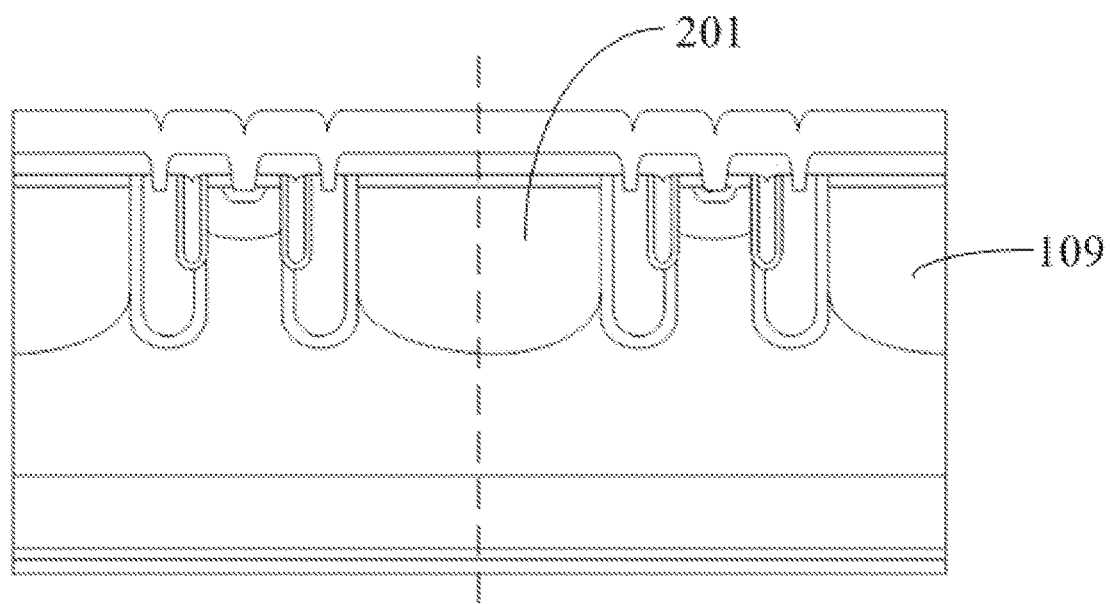
FIG. 2 is a schematic structural diagram of a semiconductor structure according to an embodiment of the present disclosure.

As shown in FIG. 2, an embodiment of the present disclosure provides a semiconductor structure, including a plurality of IGBT cell structures shown in FIG. 1 in parallel. A depth of the floating P region of the IGBT cell structure is the same as a depth of the first trench 102, and floating P regions 109 of two adjacent IGBT cell structures are connected to form a floating P region 201.

A depth of the floating P region 201 in the semiconductor structure provided in this embodiment is the same as or approximates the depth of the first trench. When the device is in a reverse blocking state, the floating P region can withstand a main electric field, so that the electric field does not concentrate at the bottom of the first trench, which improves the voltage withstand capability of the device, and prevents the device from being easily damaged by an overvoltage during application.

Figure 3:
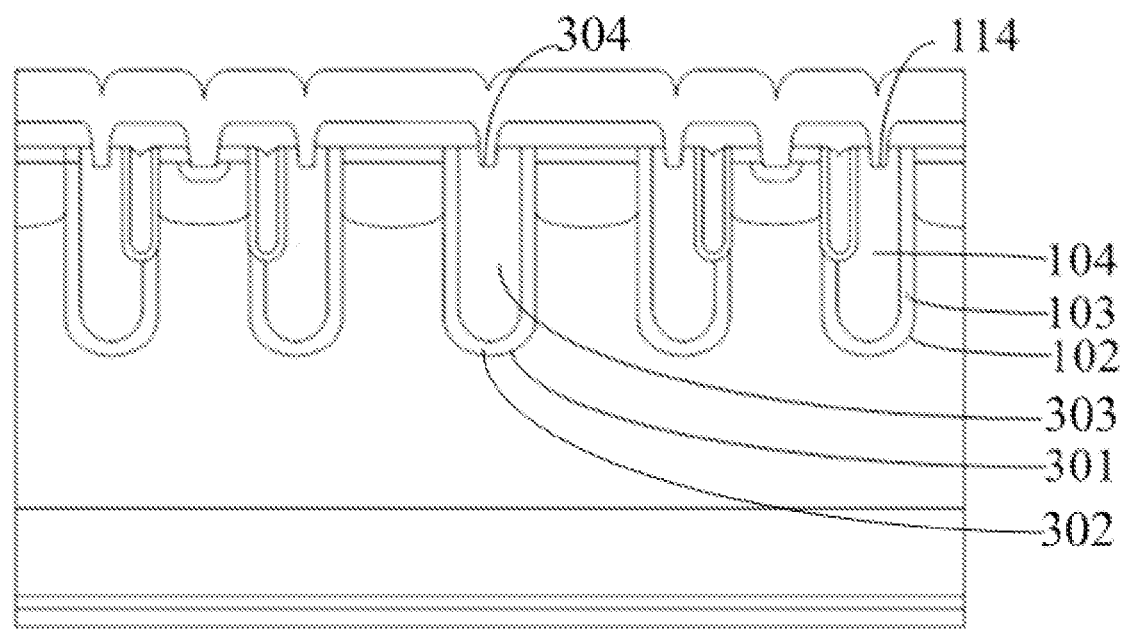
FIG. 3 is a schematic structural diagram of another semiconductor structure according to an embodiment of the present disclosure.

As shown in FIG. 3, an embodiment of the present disclosure provides another semiconductor structure, including a plurality of IGBT cell structures shown in FIG. 1 in parallel.

Between two adjacent IGBT cell structures, at least one intermediate trench 301 is further arranged in the N-type drift layer 101; a trench insulating oxide layer 302 is arranged in the intermediate trench 301; an intermediate polysilicon layer 303 is arranged in the trench insulating oxide layer 302; the intermediate trench 301 is formed on the same layer as the first trench 102; the trench insulating oxide layer 302 is formed on the same layer as the trench-shaped insulating oxide layer 103; and the intermediate polysilicon layer 303 is formed on the same layer as the polysilicon electrode 104; the insulating dielectric isolation layer 112 further covers the intermediate trench 301, the trench insulating oxide layer 302, and the intermediate polysilicon layer 303; the insulating dielectric isolation layer 112 further has an opening 304 from which the intermediate polysilicon layer 303 is exposed, and the N+ emitter metal layer 113 fills the opening 304.

Further, between two adjacent IGBT cell structures, at least two intermediate trenches 301 are further arranged in the N-type drift layer 101; an intermediate P floating region is arranged between the two intermediate trenches 301; the intermediate P floating region is formed on the same layer as the floating P region 109; and the N+ emitter layer 110 is connected with the intermediate P floating region.

In the semiconductor structure shown in FIG. 3, at least one trench portion is arranged between adjacent IGBT cell structures. A depth and a width of the trench portion are the same as those of the first trench. During production, the trench portion and the first trench are implemented simultaneously, which does not increase the process complexity. When the device is in the reverse blocking state, the high-density deep trench can reduce the electric field at the bottom of the trench and improve the reverse voltage withstanding capability of the device. During conduction of the device, the deep trench and the floating P region can realize the same effect, which enables a surface of the device to store a large number of minority carriers, thereby reducing a conduction drop of the device. During switching, the intermediate polysilicon electrode in the trench and the polysilicon electrode in the first trench are both connected with the emitter metal layer, which adds a large collector-emitter capacitance. The capacitance can absorb noise generated during the switching of the device to a certain extent.

Based on the above IGBT cell structure, the present disclosure provides a method for manufacturing the IGBT cell structure.

A specific implementation of the method for manufacturing the IGBT cell structure is described in detail with reference to FIG. 4 to FIG. 15.

Figure 7:
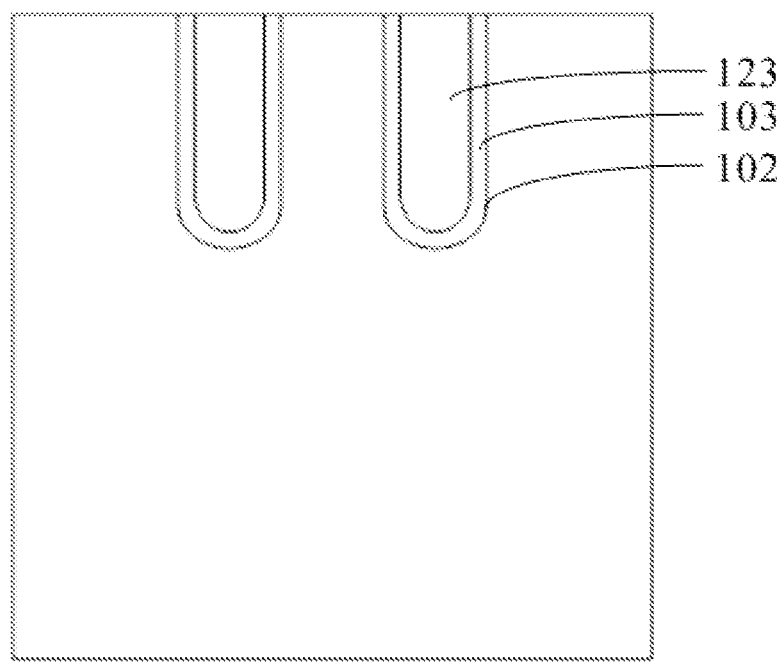
Figure 11:
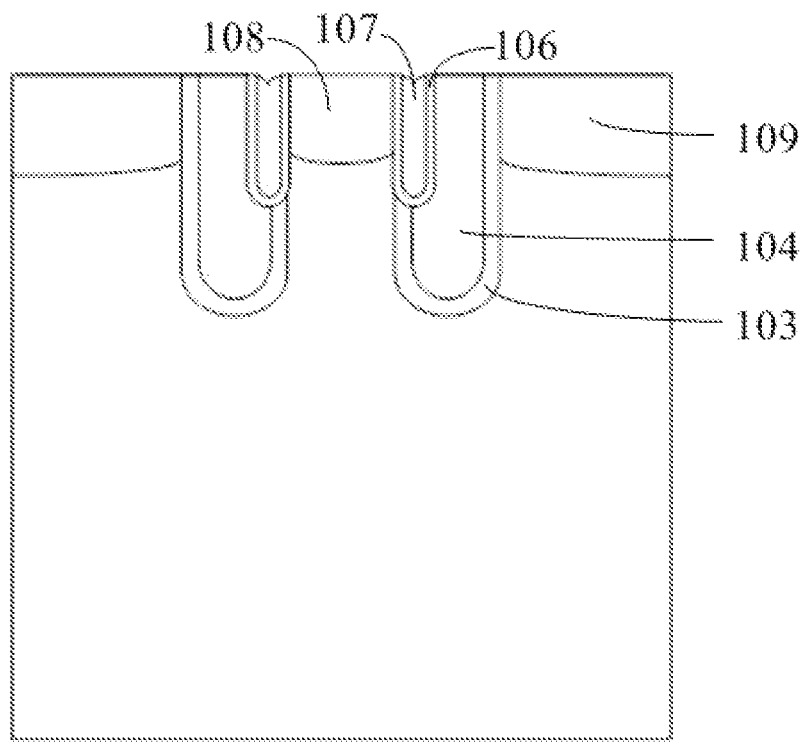

The method for manufacturing the IGBT cell structure provided in this embodiment includes:
  providing an N-type substrate 115, where the N-type substrate 115 has a front side and a back side opposite to each other;
  forming two first trenches 102 spaced apart from each other in the N-type substrate 115 through deposition, photoetching, and etching processes, forming a trench-shaped insulating oxide layer 103 in each of the first trenches 102, and depositing polysilicon in the trench-shaped insulating oxide layer 103 to form a polysilicon electrode region 123, where an opening of the trench-shaped insulating oxide layer 103 faces the front side, as shown in FIG. 7;
  forming a second trench 105 in the first trench 102 through deposition, photoetching, and etching processes, forming a trench-shaped gate oxide layer 106 in the second trench 105, and forming a polysilicon electrode 104 between the second trench 105 and the trench-shaped insulating oxide layer 103;
  depositing polysilicon in the trench-shaped gate oxide layer 106 to form a polysilicon gate 107; and
  forming a P well region 108 between the two trench-shaped insulating oxide layers 103 through P well implantation and junction push processes, and forming a floating P region 109 on each of sides of the two trench insulating oxide layers 103 facing away from the P well region 108, where the trench-shaped gate oxide layers 106 in the two second trenches 105 are adjacently connected with the P well region 108, as shown in FIG. 11.

Figure 12:
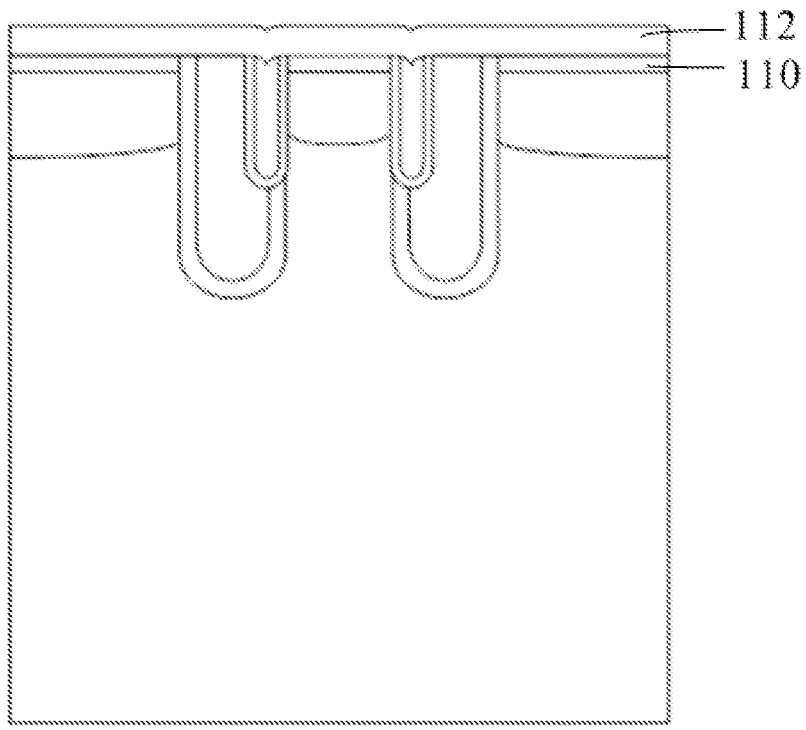

As shown in FIG. 12, an N+ emitter layer 110 connected with the floating P region 109 and the P well region 108 is formed.

Figure 13:
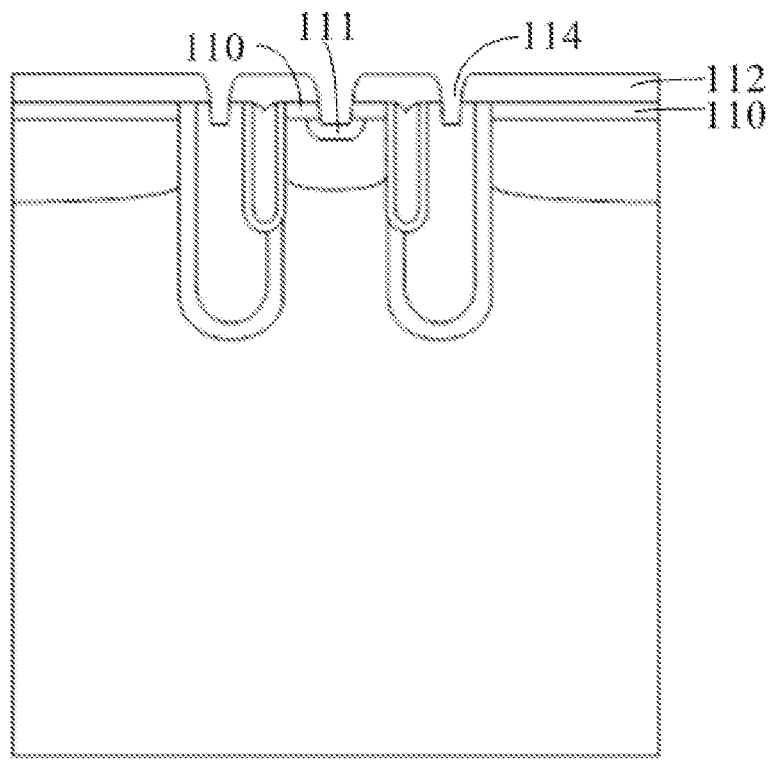

With reference to FIG. 12 and FIG. 13, a P+ region 111 connected with the N+ emitter in the P well region 108 through an ion implantation process.

An insulating dielectric isolation layer 112 is deposited on a front side of the N-type substrate, where the insulating dielectric isolation layer 112 covers the N+ emitter layer 110, the trench-shaped insulating oxide layer 103, the polysilicon electrode 104, the trench-shaped gate oxide layer 106, and the polysilicon gate 107; and the insulating dielectric isolation layer 112 has an opening 114 from which the polysilicon electrode 104 and the P+ region 111 are exposed.

Figure 14:
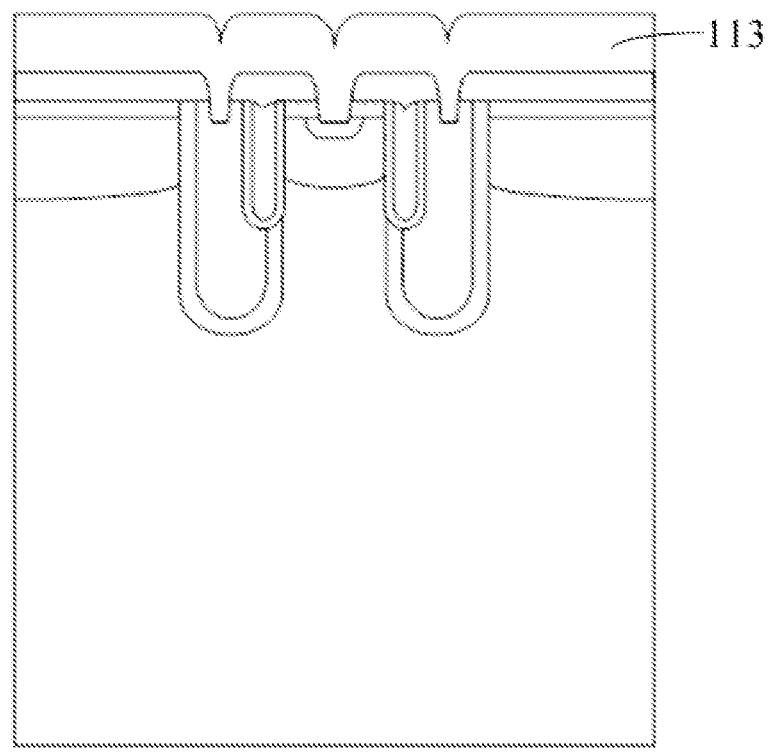

With reference to FIG. 14, an emitter metal layer 113 is formed by sputtering metal on a side of the insulating dielectric isolation layer 112 facing sway from a back side of the N-type substrate 115, where the emitter metal layer 113 fills the opening 114.

The back side of the N-type substrate 115 is thinned to form an N-type drift layer 101.

An N-type termination layer 116 is formed on a back side of the N-type drift layer 101 through ion implantation.

A P-type collector layer 117 is formed on a side of the N-type termination layer 116 facing away from the N-type drift layer 101.

Figure 15:
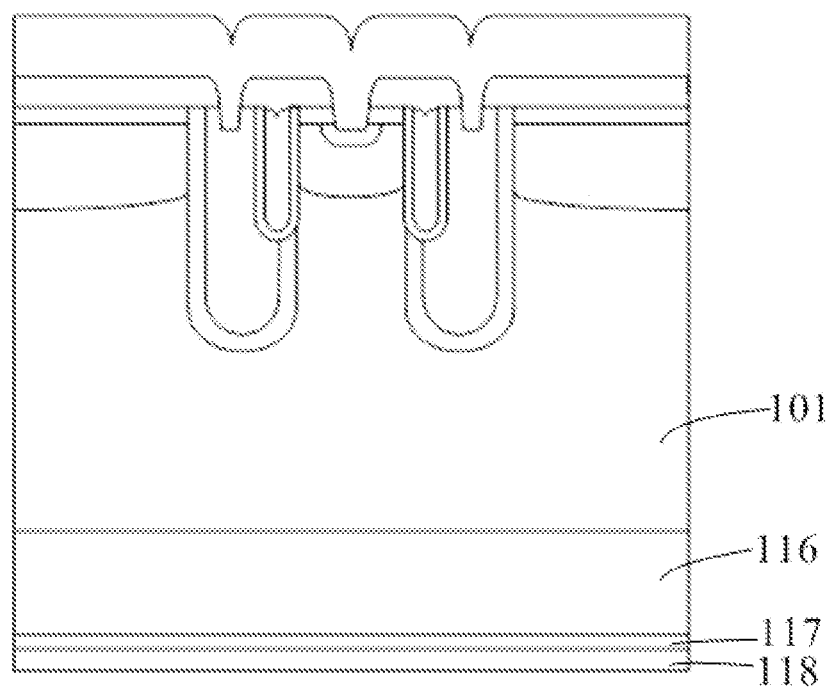

A collector metal layer 118 is formed by sputtering metal on a side of the P-type collector facing away from the N-type drift layer 101, as shown in FIG. 15.

Figure 4:
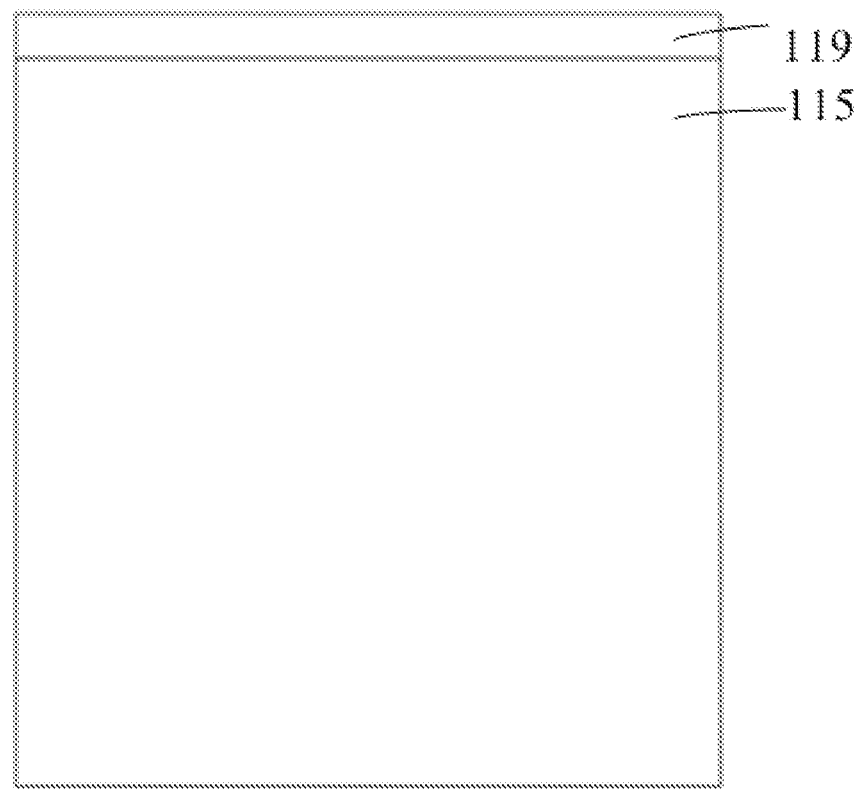
FIG. 4 to FIG. 15 are schematic structural diagrams corresponding to a series of processes of a method for manufacturing a semiconductor cell structure according to an embodiment of the present disclosure.
Figure 5:
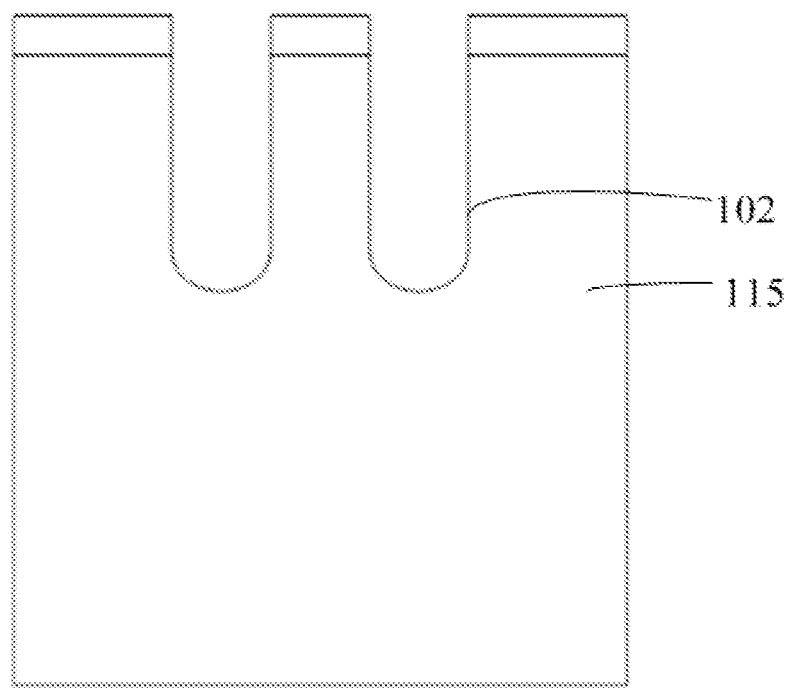
Figure 6:
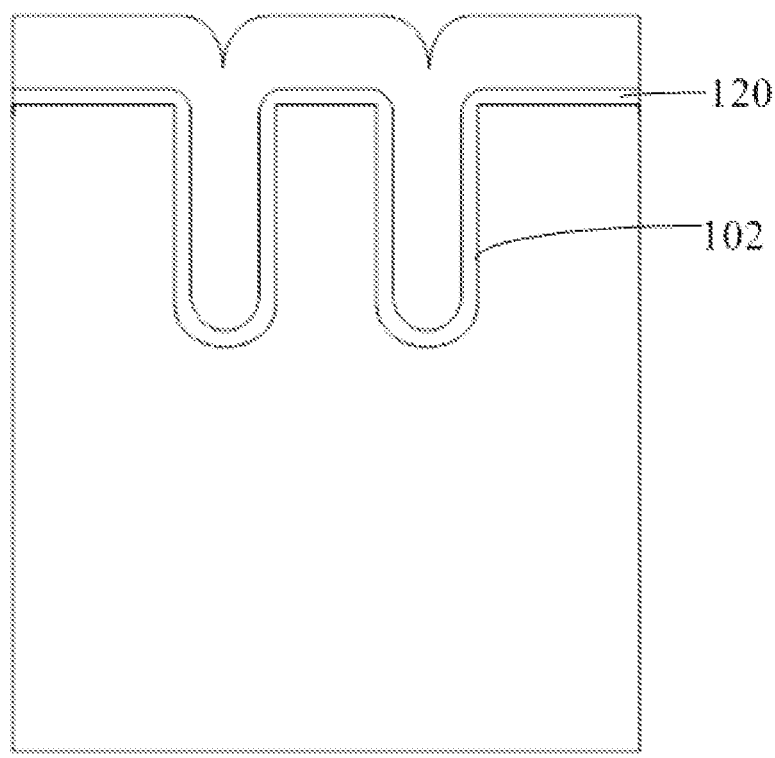

Further, the formation of the two first trenches 102 spaced apart from each other in the N-type substrate 115 through the photoetching and etching processes, the formation of the trench-shaped insulating oxide layer 103 in each of the first trenches 102, and the deposition of the polysilicon in the trench-shaped insulating oxide layer 103 to form the polysilicon electrode region 123 include:
  depositing a first dielectric layer 119 on a front side of the N-type substrate, and performing photoetching and etching on the first dielectric layer 119 and the N-type substrate 115 to form the two first trenches 102 spaced apart from each other in the N-type substrate, as shown in FIG. 4 and FIG. 5;
  removing the remaining first dielectric layer 119, and growing an insulating oxide layer 120 and depositing polysilicon on the front side of the N-type substrate 115 and in the first trenches 102, as shown in FIG. 6; and
  removing the insulating oxide layer 120 and the polysilicon on the front side of the N-type substrate 115 through chemical mechanical grinding, and forming, in the first trench 102, the trench-shaped insulating oxide layer 103 and the polysilicon electrode region 123 located in the trench-shaped insulating oxide layer 103, as shown in FIG. 7.

Figure 8:
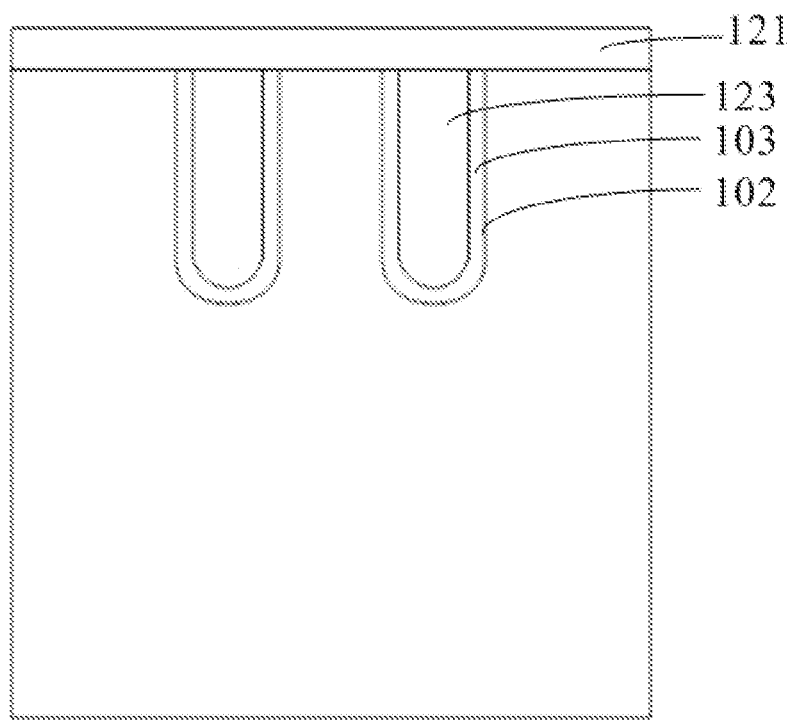
Figure 9:
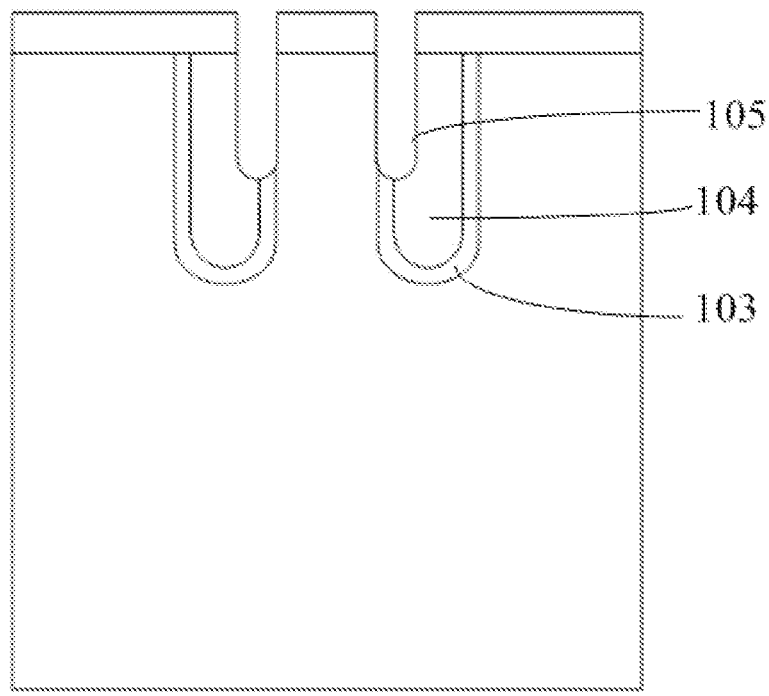
Figure 10:
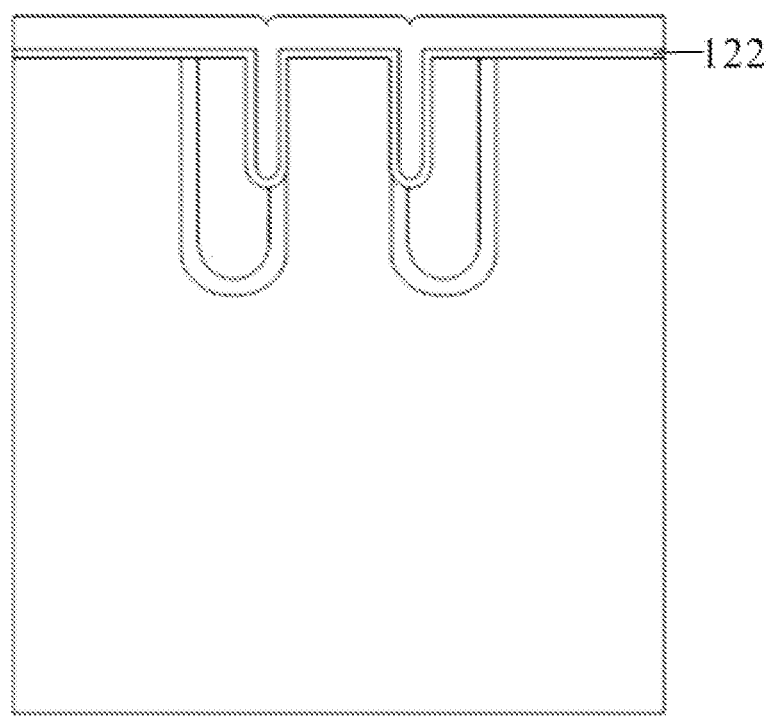

Further, the formation of the second trench 105 in the first trench 102 through the deposition, photoetching, and etching processes, the formation of the trench-shaped gate oxide layer 106 in the second trench 105, and the deposition of the polysilicon in the trench-shaped gate oxide layer 106 to form the polysilicon gate 107 include:
  depositing a second dielectric layer 121 on a front side of the N-type substrate, and performing photoetching and etching on the second dielectric layer 121, the polysilicon electrode region 123, and the trench-shaped insulating oxide layer 103, to form the second trench 105 in the first trench 102;
  removing the remaining second dielectric layer 121, and growing a gate oxide layer 122 and depositing polysilicon on the front side of the N-type substrate 115 and in the second trench 105, as shown in FIG. 8 to FIG. 10; and etching the polysilicon back to a top of the second trench 105, removing the gate oxide layer 122 on the front side of the N-type substrate 115 to form the trench-shaped gate oxide layer 106 in the second trench 105, and forming the polysilicon gate 107 in the trench-shaped gate oxide layer 106, as shown in FIG. 11.

In the manufacturing method, since the first trench is deeper than the second trench, the second trench falls in the first trench, and the second trench is a gate trench, only a small contact area is formed between the gate region and the N-type drift layer, so that the IGBT has a small Miller capacitance, which improves the turn-on efficiency of the device and reduce the switching loss of the device.

The above description is merely a preferred embodiment of the present disclosure and a description of the applied technical principles. A person skilled in the art should understand that the scope of the present disclosure is not limited to the technical solutions formed by the specific combination of the above technical features, but also covers other technical solutions formed by any combination of the above technical features or their equivalent features without departing from the concept of the present disclosure, for example, technical solutions formed by replacing the above features with (but not limited to) technical features having similar functions disclosed in the present disclosure.

INDUSTRIAL PRACTICABILITY

Through the embodiments of the present disclosure, a semiconductor cell structure with excellent performance can be obtained. The semiconductor cell structure and the semiconductor cell structure obtained through the method have very small Miller capacitances, which improves the turn-on efficiency of the device and reduce the switching loss of the device. Therefore, the present disclosure has strong practicability.

What is claimed is:

1. An insulated gate bipolar transistor (IGBT) cell structure, comprising:
an N-type drift layer, an N-type termination layer, a P-type collector layer, and a collector metal layer stacked in sequence, wherein:
on a side of the N-type drift layer facing away from the P-type collector layer and in the N-type drift layer, the IGBT cell structure comprises: two first trenches spaced apart from each other, a trench-shaped insulating oxide layer formed on an inner wall of each of the first trenches, a polysilicon electrode located in the trench-shaped insulating oxide layer, second trenches, each formed on the inner wall of the first trench, a trench-shaped gate oxide layer located in the second trench, a polysilicon gate located in the trench-shaped gate oxide layer, a P well region located between the first trenches, and two floating P regions spaced apart from each other;
the trench-shaped insulating oxide layer and the polysilicon gate in the first trench are both adjacently connected with the second trench in the first trench; the trench-shaped gate oxide layer is isolated from the trench-shaped insulating oxide layer through the polysilicon electrode; a depth of each of the floating P regions does not exceed a depth of the first trench; the floating P region is isolated from the P well region through the trench-shaped insulating oxide layer; and the gate oxide layers in the two second trenches are adjacently connected with the P well region.

2. The IGBT cell structure according to claim 1, wherein in the N-type drift layer, the IGBT cell structure further comprises an N+ emitter layer; the N+ emitter layer is formed on sides of the floating P region and the P well region facing away from the P-type collector layer; a P+ region connected with the N+ emitter layer is arranged in the P well region;
on the side of the N-type drift layer facing away from the P-type collector layer, the IGBT cell structure further comprises an insulating dielectric isolation layer and an emitter metal layer arranged in sequence in a direction of being close to the P-type collector layer to being far away from the P-type collector layer; the insulating dielectric isolation layer covers the N+ emitter layer, the trench-shaped insulating oxide layer, the polysilicon electrode, the trench-shaped gate oxide layer, and the polysilicon gate; the insulating dielectric isolation layer has an opening from which the polysilicon electrode and the P+ region are exposed; and the emitter metal layer covers the insulating dielectric isolation layer and fills the opening.

3. The IGBT cell structure according to claim 1, wherein the depth of the first trench ranges from 4 μm to 8 μm; and a depth of the second trench ranges from 2 μm to 5 μm.

4. The IGBT cell structure according to claim 1, wherein a width of the second trench is less than a width of the first trench by a range of 0.6 μm to 1.0 μm; the width of the first trench ranges from 1.4 μm to 2.2 μm; and the width of the second trench ranges from 0.8 μm to 1.2 μm.

5. The IGBT cell structure according to claim 1, wherein at least one of the following doping concentration conditions is satisfied:
a doping concentration of the P well region ranges from $1 \times 10^{16}$ cm$^{-3}$ to $1 \times 10^{19}$ cm$^{-3}$;
a doping concentration of the P+ region ranges from $1 \times 10^{19}$ cm$^{-3}$ to $1 \times 10^{22}$ cm$^{-3}$; and
a doping concentration of the N+ emitter layer ranges from $1 \times 10^{19}$ cm$^{-3}$ to $1 \times 10^{23}$ cm$^{-3}$.

6. A semiconductor structure, comprising a plurality of IGBT cell structures in parallel according to claim 1, wherein:
a depth of the floating P region of the IGBT cell structure is the same as the depth of the first trench; and floating P regions of two adjacent IGBT cell structures are connected to form a floating P region.

7. A semiconductor structure, comprising a plurality of IGBT cell structures in parallel according to claim 1, wherein:
between two adjacent IGBT cell structures, at least one intermediate trench is further arranged in the N-type drift layer;
a trench insulating oxide layer is arranged in the intermediate trench;
an intermediate polysilicon layer is arranged in the trench insulating oxide layer;
the intermediate trench is formed on the same layer as the first trench;
the trench insulating oxide layer is formed on the same layer as the trench-shaped insulating oxide layer; and
the intermediate polysilicon layer is formed on the same layer as the polysilicon electrode.

8. The semiconductor structure according to claim 7, wherein between two adjacent IGBT cell structures, at least two intermediate trenches are further arranged in the N-type drift layer; an intermediate P floating region is arranged between the two intermediate trenches; and the intermediate P floating region is formed on the same layer as the floating P region.

9. A method for manufacturing an insulated gate bipolar transistor (IGBT) cell structure, comprising:
providing an N-type substrate, wherein the N-type substrate has a front side and a back side opposite to each other;
forming two first trenches spaced apart from each other in the N-type substrate through deposition, photoetching, and etching processes, forming a trench-shaped insulating oxide layer in each of the first trenches, and depositing polysilicon in the trench-shaped insulating oxide layer to form a polysilicon electrode region, wherein an opening of the trench-shaped insulating oxide layer faces the front side;
forming a second trench in the first trench through deposition, photoetching, and etching processes, forming a trench-shaped gate oxide layer in the second trench, and forming a polysilicon electrode between the second trench and the trench-shaped insulating oxide layer;
depositing polysilicon in the trench-shaped gate oxide layer to form a polysilicon gate; and
forming a P well region between the two trench-shaped insulating oxide layers through P well implantation and junction push processes, and forming a floating P region on each of sides of the two trench-shaped insulating oxide layers facing away from the P well region, wherein the trench-shaped gate oxide layers in the two second trenches are adjacently connected with the P well region.

10. The method according to claim 9, wherein after the forming a floating P region, the method further comprises:
forming an N+ emitter layer connected with the floating P region and the P well region;
forming a P+ region connected with the N+ emitter in the P well region through an ion implantation process;
depositing an insulating dielectric isolation layer on a front side of the N-type substrate, wherein the insulating dielectric isolation layer covers the N+ emitter layer, the trench-shaped insulating oxide layer, the polysilicon electrode, the trench-shaped gate oxide layer, and the polysilicon gate; and the insulating dielectric isolation layer has an opening from which the polysilicon electrode and the P+ region are exposed;
forming an emitter metal layer by sputtering metal on a side of the insulating dielectric isolation layer facing sway from a back side of the N-type substrate, wherein the emitter metal layer fills the opening;
thinning the back side of the N-type substrate to form an N-type drift layer;
forming an N-type termination layer on a back side of the N-type drift layer through ion implantation;
forming a P-type collector layer on a side of the N-type termination layer facing away from the N-type drift layer; and
forming a collector metal layer by sputtering metal on a side of the P-type collector facing away from the N-type drift layer.

11. The method according to claim 9, wherein the forming two first trenches spaced apart from each other in the N-type substrate through photoetching and etching processes, forming a trench-shaped insulating oxide layer in each of the first trenches, and depositing polysilicon in the trench-shaped insulating oxide layer to form a polysilicon electrode region comprise:
depositing a first dielectric layer on a front side of the N-type substrate, and performing photoetching and etching on the first dielectric layer and the N-type substrate to form the two first trenches spaced apart from each other in the N-type substrate;
removing the remaining first dielectric layer, and growing an insulating oxide layer and depositing polysilicon on the front side of the N-type substrate and in the first trenches; and
removing the insulating oxide layer and the polysilicon on the front side of the N-type substrate through chemical mechanical grinding, and forming, in the first trench, the trench-shaped insulating oxide layer and the polysilicon electrode region located in the trench-shaped insulating oxide layer.

12. The method according to claim 9, wherein the forming a second trench in the first trench through deposition, photoetching, and etching processes, forming a trench-shaped gate oxide layer in the second trench, and depositing polysilicon in the trench-shaped gate oxide layer to form a polysilicon gate comprise:
depositing a second dielectric layer on a front side of the N-type substrate, and performing photoetching and etching on the second dielectric layer, the polysilicon electrode region, and the trench-shaped insulating oxide layer, to form the second trench in the first trench;
removing the remaining second dielectric layer, and growing a gate oxide layer and depositing polysilicon on the front side of the N-type substrate and in the second trench; and
etching the polysilicon back to a top of the second trench, removing the gate oxide layer on the front side of the N-type substrate to form the trench-shaped gate oxide layer in the second trench, and forming the polysilicon gate in the trench-shaped gate oxide layer.

13. A semiconductor cell structure, comprising:
an N-type drift layer, an N-type termination layer, a P-type collector layer, and a collector metal layer stacked in sequence, wherein:
on a side of the N-type drift layer facing away from the P-type collector layer and in the N-type drift layer, the semiconductor cell structure comprises: two first trenches spaced apart from each other, a trench-shaped insulating oxide layer formed on an inner wall of each of the first trenches, a polysilicon electrode located in the trench-shaped insulating oxide layer, second trenches, each formed on the inner wall of the first trench, a trench-shaped gate oxide layer located in the second trench, a polysilicon gate located in the trench-shaped gate oxide layer, a P well region located between the first trenches, and two floating P regions spaced apart from each other;
the trench-shaped insulating oxide layer and the polysilicon gate in the first trench are both adjacently connected with the second trench in the first trench; the trench-shaped gate oxide layer is isolated from the trench-shaped insulating oxide layer through the polysilicon electrode; a depth of each of the floating P regions does not exceed a depth of the first trench; the floating P region is isolated from the P well region through the trench-shaped insulating oxide layer; and the gate oxide layers in the two second trenches are adjacently connected with the P well region.

* * * * *